United States Patent [19]

Blair

[11] Patent Number: 4,914,276

[45] Date of Patent: Apr. 3, 1990

[54] EFFICIENT HIGH TEMPERATURE RADIANT FURNACE

[75] Inventor: David W. Blair, Princeton, N.J.

[73] Assignee: Princeton Scientific Enterprises, Inc., Princeton, N.J.

[21] Appl. No.: 193,725

[22] Filed: May 12, 1988

[51] Int. Cl.$^4$ ............................................. H05B 3/64
[52] U.S. Cl. ............................... 219/390; 219/343; 219/411; 118/725
[58] Field of Search ............... 219/390, 388, 343, 354, 219/405, 411; 118/725

[56] References Cited

U.S. PATENT DOCUMENTS

| | | | |
|---|---|---|---|
| 2,787,457 | 4/1957 | Bogdan | 219/388 |
| 3,316,387 | 4/1967 | Waldron | 219/354 |
| 3,343,518 | 9/1967 | Westeren | 118/725 |
| 3,862,397 | 1/1975 | Anderson et al. | 219/405 |
| 3,972,682 | 8/1976 | Stephens | 219/390 |
| 4,081,313 | 3/1978 | McNeilly et al. | 156/610 |
| 4,097,226 | 6/1978 | Erikson et al. | 432/120 |
| 4,101,759 | 7/1978 | Anthony et al. | 219/343 |
| 4,167,915 | 9/1979 | Toole | 219/390 |
| 4,347,431 | 8/1982 | Pearce | 219/390 |
| 4,375,027 | 2/1983 | Zeto et al. | 219/390 |
| 4,503,319 | 3/1985 | Moritoki | 219/390 |
| 4,511,788 | 4/1985 | Arai et al. | 219/405 |
| 4,545,327 | 10/1985 | Campbell | 118/725 |
| 4,753,192 | 6/1988 | Goldsmith | 118/725 |

FOREIGN PATENT DOCUMENTS

| | | | |
|---|---|---|---|
| 52-532A29 | 11/1976 | Japan | 219/390 |
| 56-48128A | 5/1981 | Japan | 219/405 |
| 1036905 | 4/1963 | United Kingdom | 219/390 |
| 1466999 | 3/1977 | United Kingdom | 219/390 |

Primary Examiner—Teresa J. Walberg
Attorney, Agent, or Firm—Richard C. Woodbridge

[57] ABSTRACT

A tubular radiant furnace having multiple radiation shields is capable of producing very high working temperatures in an extremely clean environment. A cool-walled quartz muffle tube surrounded by high temperature electrical heaters in a high temperature cavity defines the work chamber. Concentric radiation shields around the tube and the heaters are supplemented by end shields at both ends to form the high temperature cavity. The shields reduce the radiative loss from the tube and create a uniform high temperature cavity without adding significant thermal inertia to the system. The low thermal inertia leads to a fast response time for the furnace to heat up or cool down. A workpiece located within the working chamber sees the radiant field with a view factor that approaches 100 percent (100%), and this helps make possible the attainment of very high and uniform temperatures. The effect is enhanced by the proximity of the workpiece to the center of the working chamber. The furnace is capable of producing temperatures above 1,800K, and it is believed capable of operating in ranges up to 3,300K. Furnaces of this type are useful in the production of semiconductors and other materials that require very clean and uniform high temperature conditions. They are also useful in the production of materials that require very rapid heat up or cool down conditions.

17 Claims, 7 Drawing Sheets

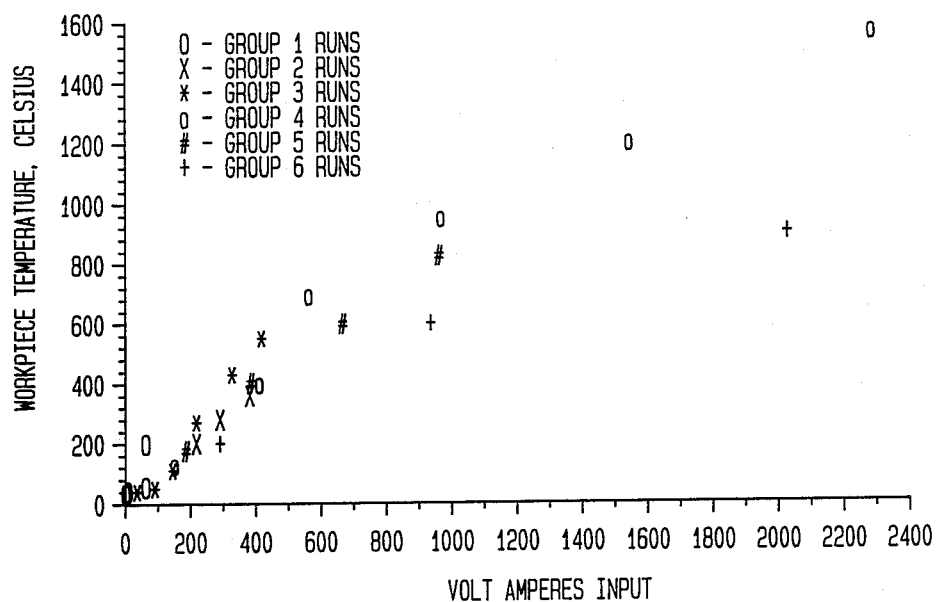
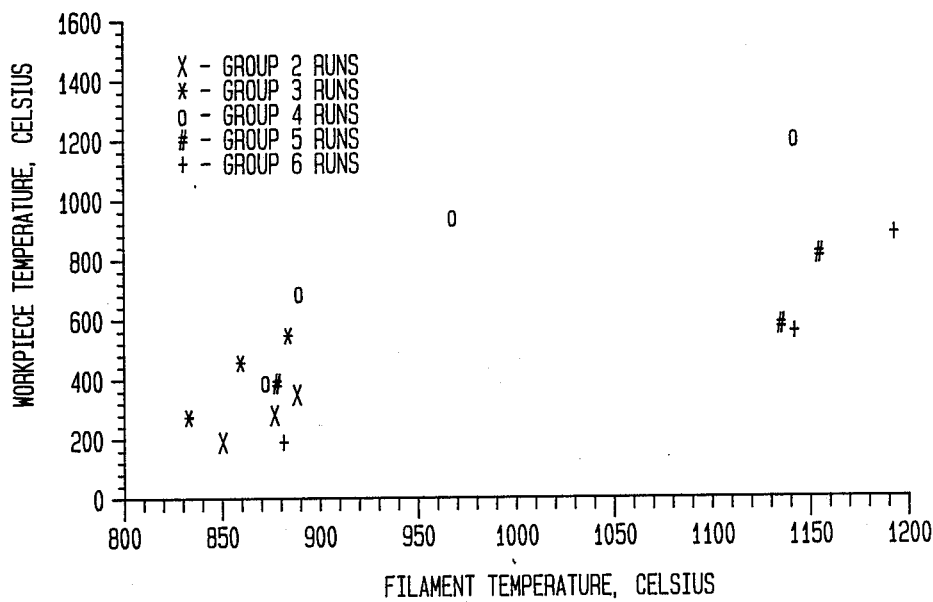

COOLANT AND WORKPIECE TEMPERATURES
VERSUS INPUT POWER FOR GROUP 4

EFFECT OF VIEWFACTOR ON WORKPIECE TEMPERATURE
HEATLOSS BY RADIATION ONLY

SOLID ANGLE OF RADIATOR ABOUT RECEIVER DESCRIBING EFFECT OF VIEWFACTOR

TYPICAL LAMP DISTRIBUTIONS IN PRIOR ART FURNACES HAVING REDUCED VIEWFACTOR

HEAT GAIN AND LOSS CONES WITH RECEIVER
NEAR CENTER OF THE FURNACE SHOWING
"LONGITUDINAL" VIEWFACTOR

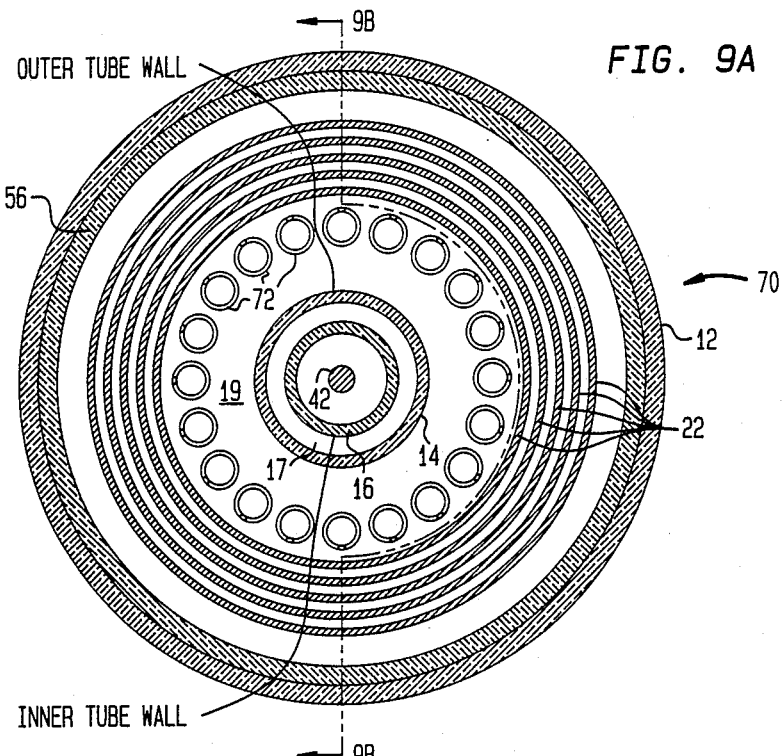
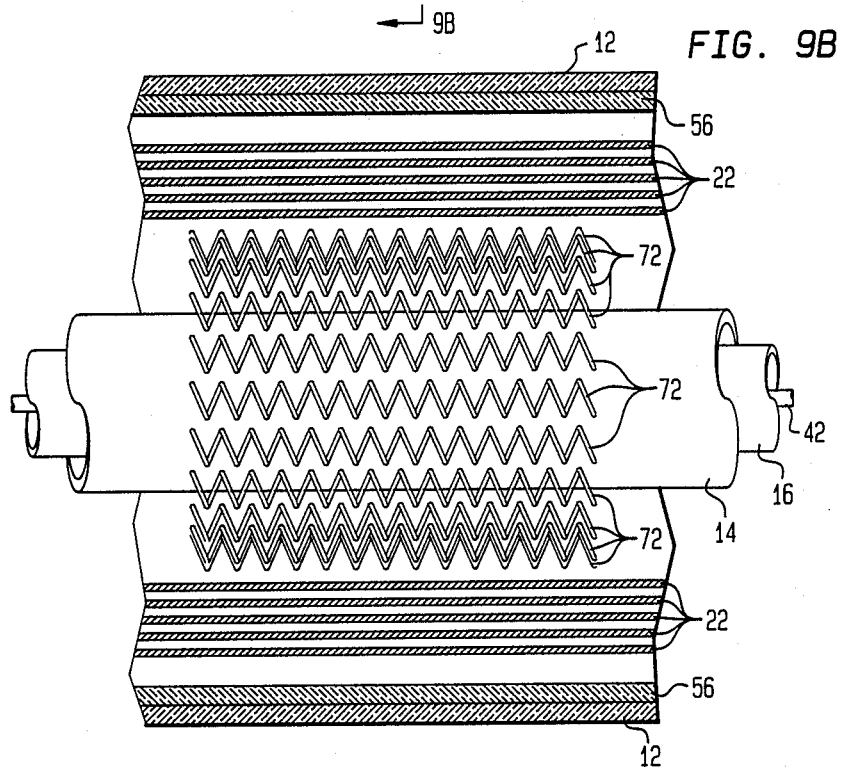

EFFICIENT HIGH TEMPERATURE RADIANT FURNACE

GOVERNMENT RIGHTS

This invention was made with Government support under Contract No. NAS8-37325 awarded by the National Aeronautics and Space Administration. The Government has certain rights in this invention.

BACKGROUND OF THE INVENTION

1. Fields of the Invention

This invention relates to a radiant furnace capable of efficiently achieving very high and uniform temperatures in a very clean environment.

2. Description of Related Art

A variety of radiant furnace designs are known for the purpose of producing high temperature environments in which semiconductors and other materials can be processed. Unfortunately, the structure of those prior art designs often severely limits their maximum temperature capabilities and/or their ability to produce uniform heating, as well as their energy efficiency. Such prior art furnaces also tend to be expensive to build and operate.

U.S. Pat. No. 3,862,397 is typical of many cool walled radiantly heated reactors. The workpiece is surrounded by a bell jar which is heated from the outside by a plurality of lamps. Reflectors are placed behind each of the lamps in order to concentrate energy, and a suitable coolant, such as air, passes through the hollow reflectors and between the radiant elements and the bell jar in order to keep the environment relatively cool.

Similarly, U.S. Pat. No. 3,316,387 discloses an electric lamp employing a heated sheet radiator. A Reflective surface is also employed as well as cooling fluid between two sheets of quartz.

U.S. Pat. No. 4,375,027 discloses a dual chambered high pressure furnace which employs blanket gases in the cooling chamber. A quartz crucible surrounds the heated area.

U.S. Pat. No. 4,101,759 discusses the use of cooling gases in the context of a semiconductor body heater in which the radiant heat is provided by a plurality of tungsten filament quartz lamps behind which a reflective surface is located.

U.S. Pat. No. 4,511,788 describes a light-radiant heating furnace which is cooled by water rather than gas.

U.S. Pat. Nos. 4,081,313 and 4,097,226 describe other furnace structures of lesser relevance.

The foreign patent literature also describes efforts to produce high efficiency, low cost radiant furnace devices.

For example, Japanese Patent No. 56-48128A discloses a heat treatment invention in which semiconductor substrates are directly heated by radiation from infrared lamps. Gas is introduced between a quartz reactor tube and the infrared lamps to cool the reactor. Surface reflectors are provided behind the lamps to improve the heating of the substrate. Japanese Patent No. 52532A/29 describes an electric oven including interconnected heating segments and a reflective wall assembly to correct for lack of uniformity of heating.

British Patent No. 1,466,99 describes a laboratory furnace having a refractory lining insulation which includes reflective surfaces for reflecting heat towards the center of the apparatus.

Lastly, British Patent No. 1,036,905 discloses a furnace in which gases are passed between an inner and outer tube, though it is not clear if the purpose of the gases is to provide cooling.

While the foregoing patents are typical of the prior art, they are not believed to have been able to achieve the high uniform temperatures, heating rates, economy, and efficiency of the present invention.

SUMMARY OF THE INVENTION

Briefly described, the invention comprises a tubular radiant furnace with electrical resistance heaters which surround a cool-walled quartz muffle tube that defines a work space. The muffle tube is cooled by vigorous forced convection, and it is uniformly surrounded by the resistance heaters and insulated cavity walls at near the heater temperature to provide a highly uniform radiant field within the work space. In one embodiment device, helical tungsten filament heater coils were located coaxially with the muffle tube to provide a near uniform radiant source, and they were surrounded on their outer diameter by radiation shields which both enhanced the uniformity of the field and greatly increased the energy efficiency of the device. As a result of this novel structure, a workpiece located near the center of the workspace has a near 100% view factor of the high temperature radiant field. There are no significant gaps in the field through which a workpiece can lose rather than gain heat. This maximizes the temperature that the workpiece can attain with the heaters set at any given temperature. Workpiece temperature will closely approach heater temperature, and it will do so in a work chamber that has cool, or even cold, walls, Thus, the environment of the workspace can be exceedingly clean, uncontaminated even by the vapor pressure of the chamber walls. Multiple concentric radiation shields around the heaters effectively reduce outwardly directed radiant energy losses, and the temperature of the innermost shield approaches that of the heaters themselves. The shields form the radiant cavity wall that surrounds the heaters and muffle tube, and enhance the uniformity of the radiation field as it also increases the energy efficiency of the system. Multiple radiation shielding is similarly employed at both ends of the radiant cavity. While making significant improvements to the uniformity of the radiation field and the energy efficiency of the device, the radiation shielding adds very little thermal inertia to it. Thus, the heat up and cool down response times of the furnace are very fast. The walls of the quartz tubes are vigorously cooled by the forced convection of a fluid, which may be either a liquid or a gas. In one embodiment, nitrogen gas was used. The cooling removes heat deposited in the walls of the tubes by radiant transmission losses. A suitable halogenated gas (e.g. a gas containing such additive species as $Cl_2$, $CH_2Br_3$, $CBrF_3$, or other halogenated species) can be used to maintain non-blackened walls and to regenerate incipient high temperature filament breaks. Ultimately, the furnace is expected to produce workpiece temperatures up to 3,300 K., while it has presently demonstrated workpiece temperatures in excess of 1,800 K. with a very rapid response time. These and other features of the present invention will be more fully understood by reference to the following drawings:

BRIEF DESCRIPTION OF THE DRAWINGS

FIG. 4 is a graph of the workpiece temperature as a function of electrical power input.

FIG. 5 is a graph of the workpiece temperature as a function of apparent heater filament temperature.

FIG. 9A illustrates an alternative embodiment of the present invention especially suitable for heating large workpieces wherein the heat source comprises a plurality of long, electrical resistance heaters as seen from the end thereof.

FIG. 9B is a side elevational view of the alternative embodiment illustrated in FIG. 9A.

DETAILED DESCRIPTION OF THE PREFERRED EMBODIMENT

During the course of this description, like numbers will be used to identify like elements according to the different figures which illustrate the invention.

Figure 1:
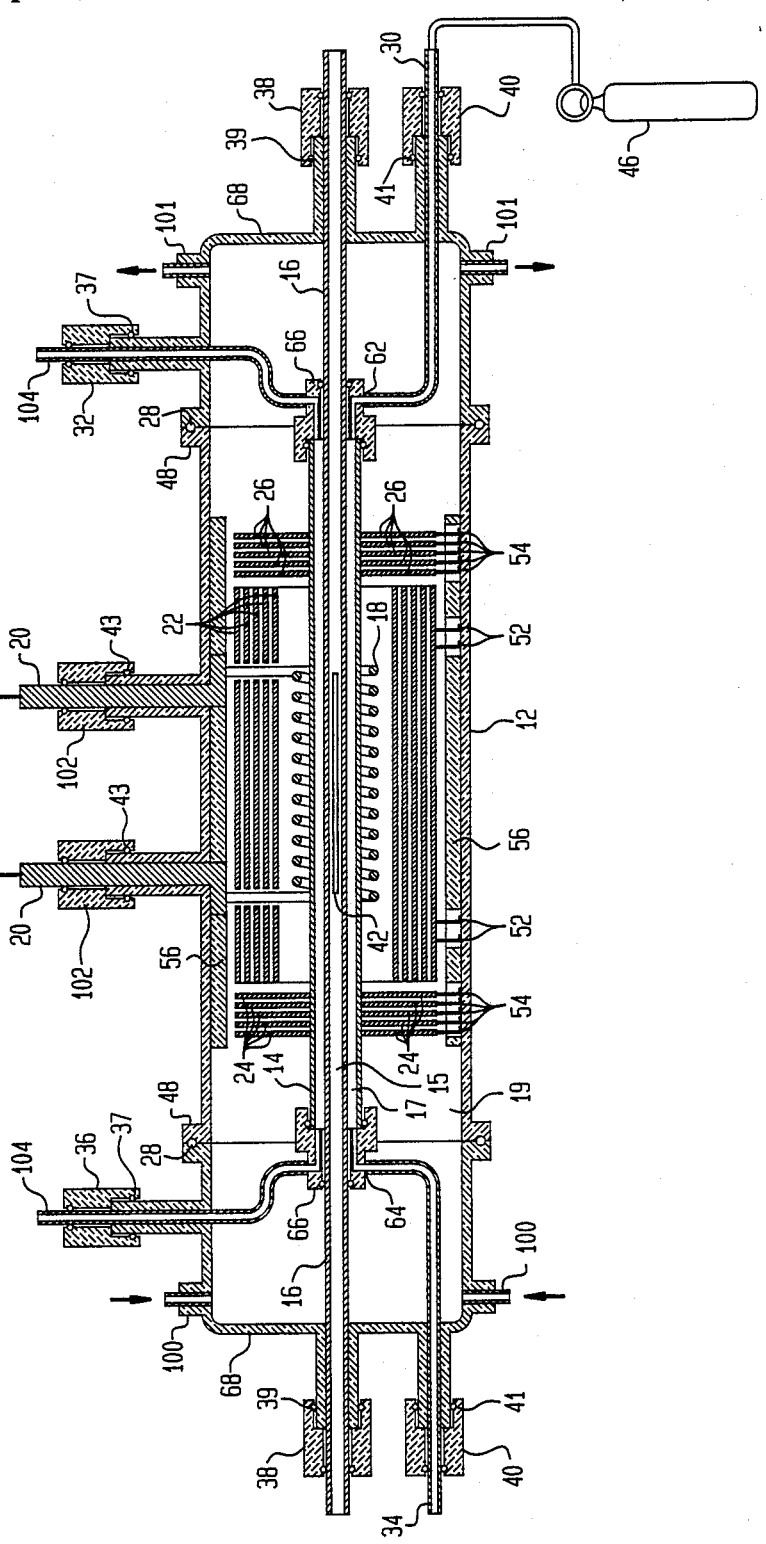
FIG. 1 is a longitudinal cross-sectional diagram of the preferred embodiment of the radiant furnace invention.
Figure 2:
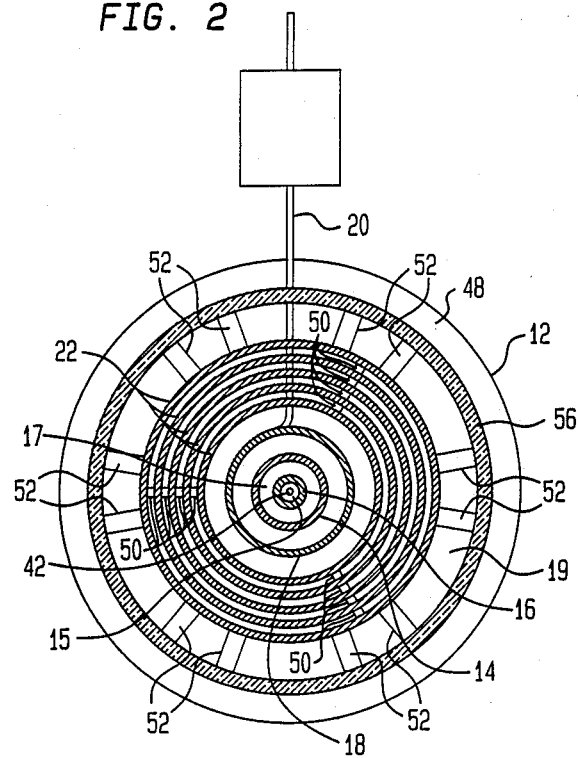
FIG. 2 is an end cross-sectional view of the invention showing a helical coil heater and multiple shields in place surrounding the central quartz tube.

The basic invention 10 according to the preferred embodiment is illustrated in FIG. 1 and the cross-sectional end view thereof is show in FIG. 2.

The apparatus 10 is housed within an outer shell 12. An outer quartz tube 14 surrounds an inner quartz tube 16 defining a working chamber 15 which contains a workpiece 42. Quartz is preferred because it is a good transmitter of radiation, especially in the near infrared, and it has good structural and thermal properties. Other materials, e.g. sapphire or even glass, with good transmission properties can also be used. A helical heating coil 18 concentrically surrounds tubes 14 and 16 and is supplied with power from a power supply 44 via electrodes 20. Five tantalum radiation shields 22 held in place by supports 52 concentrically surround tubes 14 and 16 and the heating coil 18 and serve both to form the walls of a radiation cavity with a temperature potential near that of the heating coil 18 and to effectively reduce radiated heat loss. Tantalum was used for the preferred embodiment. Other refractory materials, metals or non-metals, can also be used. They need only be able to withstand the high temperature. Also, the outermost shield may be surrounded by insulation 56 to further improve the performance of the furnace. Multiple layer end shields 24 and 26 prevent heat from escaping to the extremities of the furnace 10. End shields 24 and 26 are held in place by supports 54 and they may also be surrounded by insulation to further improve the performance of the furnace. A nitrogen coolant from a compressed gas container 46 is introduced through coolant inlet 30 through internal port 62 into the annulus 17 between tubes 14 and 16, passes out through internal port 64 and is discharged through coolant outlet 34. Internal ports 62 and 64 are formed in tube supports 66. Other gases or liquids can also be used—air, for example. For extreme cooling, even liquid nitrogen can be used. An O-ring seal holder 40 and O-ring 41 keep the nitrogen coolant from escaping from the inlet 30. Likewise, an O-ring seal holder 40 and O-ring 41 prevents nitrogen from escaping from the outlet 34. Gas inlets 100 serve to admit gas to the radiant cavity containing the electric heater 18 and radiation shields 22, 24 and 26 and gas outlets 101 serve to exhaust gas from the cavity, thus providing for controlled atmospheres. Argon was used in the preferred embodiment—within the exterior cavity 19. O-ring seal holders 32, 36, 38 and 40 and 102 along with O-rings 37, 39, 41 and 43 serve to prevent cavity gas leakage from opposite ends of the furnace 10.

The cross-sectional end view of FIG. 2 illustrates the manner in which spacers 50 are employed to keep the radiant shields 22 in place with respect to each other. Supports 52 position the five radiant shields 22 as a group with respect to outer shell 12.

The following is a detailed description of the structure and materials employed to build the radiant furnace 10 illustrated in FIGS. 1 and 2. The inner most furnace tube 16 was an 8 mm outside diameter, 6 mm inside diameter section of circular quartz tubing 16" long defining a working chamber 15. Either quartz or other efficient transmitter of thermal radiation, such as sapphire or glass, can be used in the invention. The outer quartz tube 14 was 14 mm outside diameter by 12 mm inside diameter and 8¼" long. This provided for a circular cooling annulus 17 between tubes 14 and 16 with a 2 mm clearance. The outer furnace shell 12 was a circular section of 80 mm outside diameter by 8¼" long Pyrex ® with O-ring flanged ends 48 and matching end caps 68. The outer shell 12 of the furnace was made from Pyrex ® rather than quartz or a metal such as steel. It is believed that the use of quartz or metal would improve the general overall results achievable by the radiant furnace 10.

Heating coils 18 were wound from flat tungsten or tungsten-3% rhenium strip. Three strip 18 cross-sections were used. One was 2.5 mm wide by 0.003" thick tungsten; one was 2.0 mm thick by 0.004" thick tungsten-3% rhenium and the other was 2.46 mm wide by 0.0097" thick tungsten-3% rhenium. The helical coils 18 were ¾" in diameter by 2 3/16" long and wound with pitches to give a gap in the range of 1/32" to 1/16" between turns. The coils 18 fit over outer tube 14 with 2 mm clearance.

Radiant heating coil 18 was surrounded by a series of five cylindrical radiation shields approximately 5¼" long with 3 mm clearances between shields 22, the coil 18 and the inside of the outer shell 12. The shield material used was tantalum sheet 0.001" thick. End shields 24 and 26 were similarly fabricated to conserve radiant energy within the cavity. However, it was necessary to remove the end shields 24 and 26 during operation in order to view the coil 18 and measure its temperature. This undoubtedly decreased the measured temperature of the workpiece 42 within the furnace 10 and increased the input power to furnace 10 necessary to achieve a given temperature for workpiece 42. With shields 24 and 26 removed, the coil temperature was measured with a Leeds and Northrup Model 8622 optical pyrometer. Cooling nitrogen from container 46 entered and exited tangentially from opposite ends of the cooling annulus 17 through external ports 30 and 34 and internal ports 62 and 64, while small flows of argon gas through the coil chamber 19, and the work chamber 15 protected the coil 18, shields 22, 24 and 26 and the sheathed theromcouple which formed the workpiece 42 for purposes of taking measurements.

Two power supplies 44 were employed, supplemented by a 10:1 step down transformer. The first power supply was a Powerstat type 3PN136B variable transformer with a 22 amp secondary capacity when operated from a 110 volt supply. The second power supply was a pair of Powerstat variable transformers ganged together. It has a 45 amp secondary capability when operated from a 110 v input supply. The stepdown transformer was a Heavy Duty type HS Catalog No. HS19F2A 2 kva transformer capable of operating from either a 120 or 240 volt power supply. The output of the power supplies fed electrodes 20 connected to coil 18. The input power was measured with Emico moving iron voltmeters and ammeters (64-AAC and 64-AVC series with scale mirrors, 3% full scale) and a Hioki Model 3100 multi-tester.

The purge gas was Scientific Gas Products Ultra High Purity Argon with a SGP Model PZL Oxygen Gas Purifier on the inlets 100 to the furnace 10. Both the coil chamber 19 and the working chamber 15 were purged with small flows of argon to avoid oxidation of the hot metal parts. Argon flows were metered by rotometers and the coil chamber 19 pressure was kept at 3 psig. Argon was chosen as the most appropriate coil chamber gas. However, experimental results indicated that the long term use of a halogenated gas cleaning cycle may be useful to control darkening of outer tube 14.

The coolant used in the coolant flow system was SGP prepurified grade nitrogen. Nitrogen was used instead of air to avoid damage to the refractory metal parts in case of leakage between tube 14 and the outer chamber 19. The nitrogen coolant flow entered and exited the annulus 17 between tubes 14 and 16 through ¼" diameter holes 62 and 64 in fittings 66 at opposite ends of tube 14. The flow was metered by a rotometer of 50 scfm capacity.

The inlet and outlet coolant temperatures were measured by Omega Engineering, Inc. Model SICSS-010G-6 subminature sheathed iron/constantan thermocouples. The sheath diameter was 0.01". The monitoring points were immediately at the entrance 62 and exit 64 from the cooling annulus 17 and the thermocouples were inserted through tubes 104. The thermocouples were each equipped with Omega Model MCJ-J electronic ice points. The output signals were recorded on a Linesis Model L6512-1 single channel recorder.

The coil chamber 19 can be evacuated through exhaust ports 101 using a standard laboratory vacuum pump. Before startup, the chamber 19 was pumped down and re-pressurized with argon four times to eliminate all residual oxygen. Purge exhaust was through a ¼" diameter tube to the outside. Coolant exhaust was either through the same tube or, at high flow rates, directly into the laboratory since the coolant was, as previously discussed, nontoxic nitrogen.

The simulated workpiece 42 was an Omega Model XTA-W-5R26-U-062-30-B-Q-12 W-5%Rh/W-26%Rh thermocouple in a tantalum sheath. The sheath diameter was 1/16" and the sheath was approximately 12" long. It was inserted into work chamber 15 of inner tube 16 so that its tip was approximately at the mid-point of the heating coil 18 and not touching the walls of tube 16. The thermocouple was equipped with an Omega Model MCJ-C electronic ice point and its signal was recorded on the Linesis recorder described above.

Figure 3:
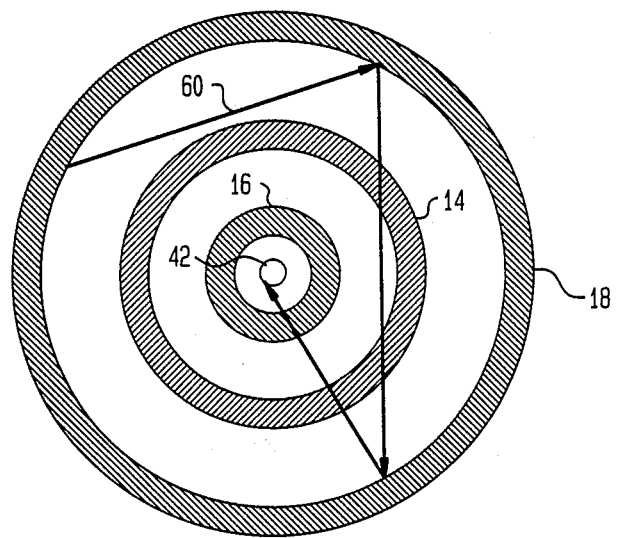
FIG. 3 is an end cross-sectional theoretical model of the invention illustrating the path taken by a typical ray towards the workpiece.

FIG. 3 illustrates the manner in which a ray 60 produced by coil 18 is eventually reflected onto the workpiece 42. Each time that the ray is reflected from a surface of the radiation cavity, either the coil 18 surface or the inner surface of shields 22, 24 or 26, it is partially reflected, partially absorbed by the surface and partially enhanced by radiation emitted from the hot surface. Thus, upon multiple reflections it quickly comes to radiative equilibrium at a temperature approaching the blackbody radiation temperature of the radiating cavity surfaces (the coil 18 and the innermost layers of the shields 22, 24 and 26). The use of shields 22, 24 and 26 and coil 18 to form a hot radiation cavity returns radiant energy much more intensely, uniformly and efficiently into the interior of the furnace and eventually onto the workpiece 42 than do prior art systems which rely upon relatively widely spaced banks of heating lamps backed up by cool reflectors from which the absorbed radiant energy is lost to the system. The use of multiple radiation shields 22, 24 and 26 significantly enhances the ability of the system 10 to direct intense rays 60 with the minimum attenuation onto the workpiece 42. Without shields 22, 24 and 26, a large portion of the radiant energy would be lost to the environment and show up as increased operating costs, lower operating temperatures and less uniform radiant heating. As ray 60 passes through the walls of tubes 14 and 16, it loses a portion of its energy through radiant absorption by the walls. This loss has two components. The first is the cutoff loss. All of the radiation that lies outside of the transmission passband of the wall material is lost. For quartz this passband extends from approximately 0.4 micrometers in the ultraviolet to 4.5 micrometers in the infrared. For sapphire it is somewhat wider, extending approximately from 0.17 micrometers in the ultraviolet to 6.5 micrometers in the infrared. The greatest cutoff energy loss lies in the infrared at the temperatures of interest in furnaces. The second loss is the transmission loss within the passband. For quartz this loss is approximately 5%. These radiant losses heat tubes 14 and 16 and thereby establish their cooling requirements. These two classes of transmission losses also exist in prior art devices which rely upon radiant transmission through transparent media, and they do not represent a loss that is peculiar to this invention. They exist in all devices that employ lamps. They exist in the transparent envelopes of the lamps as well as in other transparent media in lamp based systems.

The operating results achieved by the radiant furnace 10 are set forth in the graphs of FIGS. 4-7. FIG. 4 illustrates the workpiece 42 temperature as a function of the electrical power input. Even under sub-optimal conditions, very high temperatures ranging up to 1,582° C. were obtained supporting the conclusion that given adequate wall cooling and heating coil structural design, working temperatures far above tube wall limits are obtainable, and at quite reasonable powers. In order to measure the heating coil 18 temperature, it was necessary to remove end wall radiant shields 24 and 26, thereby increasing radiant heat loss and decreasing interior temperatures. Moreover, an improved higher current capacity power supply 44 coupled with a more structurally robust heating coil 18 design to eliminate sag, and the use of the end shields together with increased clearances between tube 14, coil 18 and shields 22 would have placed the measurable temperature of the workpiece 42 much higher. More complete shielding 22 would not only have substantially reduced the power requirement, but it would have resulted in a curve that was everywhere concave upward. This is because the fraction of radiant energy transferred through the walls of tubes 14 and 16 increases with temperature (the fraction of radiant energy lying beyond the infrared cutoff limit of tubes 14 and 16 decreases with increasing radiation temperature); but external radiation losses also increase rapidly with increasing temperature (they are proportional to the fourth power of the radiation temperature) and with inadequate shielding this loss effect dominates at the higher temperatures. The shielding 22 was less than optimal and the shielding 24 and 26 was absent because it was necessary to gain extensive optical access to inspect and measure the parameters on the inside of the furnace during the experimental operation.

The optimum use of multiple radiation shields 22, 24 and 26 will produce substantial increases in operating temperatures and energy efficiency. For an infinite parallel plane black shield, the ratio of shielded loss to unshielded loss is $1/(1+N)$ where N is the number of shields. For an infinite coaxial black cylindrical source, the ratio of shielded to unshielded loss is $$1/\left[1 + \sum_{n=1}^{N} (D_s/D_n)\right]$$

where N is the number of shields, n is the shield number, $D_s$ is the diameter of the radiating source, and $D_n$ is the diameter of the nth shield. Thus, multiple shielding is seen to be an effective way of reducing radiative loss over either the outer cylindrical surface or the ends. It can make the radiative loss arbitrarily small. Also, for any given number of shields, shielding can be enhanced by surrounding the outermost shield with insulating material 56. Thus, in an analysis of the overall system 10, the external radiative losses may be arbitrarily specified to be equal to or less than some maximum value while the internal radiative losses (transmission losses) are characteristic of the system 10 in its operating configuration, tubes 14 and 16 material and temperature.

The optimum number of shields 22, 24 and 26 will also depend upon the particular design of a given unit 10. The temperature of the innermost shield, heat loss, temperature of the outermost shield, cost and size will also affect the design. In furnaces where the heating element 18 completely surrounds the inner tubes 14 and 16 without any significant gaps, shielding 22, 24 and 26 becomes more a matter of energy conservation. For furnace structures where there are significant gaps between the heating elements which surround inner tubes 14 and 16, the temperature of the innermost shield becomes important in determining the maximum workpiece temperature that can be achieved with a given heater temperature, and in maintaining a highly uniform radiation field, as well as reducing energy losses. Under such circumstances, the optimum number of shields will be influenced by such performance factors as well as by energy efficiency, size and cost. In other words, the lower the viewfactor, the more important the multiple radiation shielding becomes.

Shielding materials other than tantalum can also be used. There are several possible materials that are usable, which depend upon the temperature desired. All materials must not be destroyed by the highest temperature they experience, that is to say they must have an acceptable lifetime at that temperature. Their vapor pressure at maximum temperature must be sufficiently low that they do not quickly evaporate and recondense on the inner tube 14 to diminish its transparency (i.e. bulb blackening) and so that they do not react with the heaters 18 and destroy them. Both metals and non-metals are acceptable as heater elements 18. Among the most useful metals are the common refractory metals tungsten, molybdenum, tantalum, and rhenium.

The shielding 22, 24 and 26 can be made from graphite such as Graphoil ® as sold by the Union Carbide Company. Graphoil ® is a specialty product sold in layered form. Other refractory insulating materials, such as zirconia and alumina are also suitable, even though they might not be preferable for the high temperature of the innermost shields.

FIG. 5 illustrates the temperature of the workpiece 42 as a function of the apparent temperature of the heater filament coil 18. The most important observation to note is that under optimal conditions, the temperature of the workpiece 42 approached that of the filament 18.

Additional data was taken to determine the relationship between workpiece temperature and the temperature of the exiting coolant nitrogen gas. It was determined that the average temperature of the inner tube 16 was less than the coolant exit temperature, and that the coolant exit temperature was well below the workpiece temperature. This was achieved even when the coil 18 collapsed onto the outer tube 14 at the highest temperatures, thus significantly increasing the coolant outlet temperature.

Figure 6:
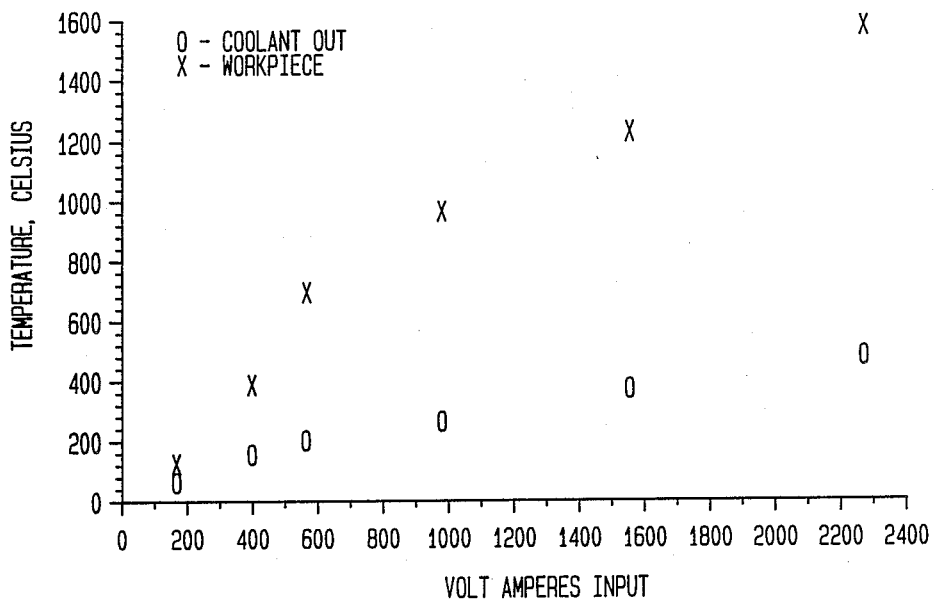
FIG. 6 is a graph of coolant and workpiece temperatures versus input power.

Data was also accumulated to determine the relationship between workpiece 42 and coolant temperatures as a function of power input as shown in FIG. 6. In summary, at low power inputs the temperature of filament 18 is low, radiative transfer to workpiece 42 is ineffective (very high fractional infrared loss to the wall of outer tube 14), and at low collant flow rates the coolant exit temperature exceeded the temperature of workpiece 42. At higher power inputs and coolant flow rates, the situation was reversed. As cooling became more vigorous, the temperature of the workpiece 42 exceeded the coolant outlet temperature and, thus, the temperature of inner tube 16. This further established the feasibility of the overall concept.

In addition to the foregoing data, measurements were taken to establish the time response of the furnace 10 to a change in power input. At the end of one test, at which time the workpiece 42 was at a temperature of 975° C., the power was abruptly cut off. The workpiece 42 reached its final temperature of 29° C. in 108 seconds. The time constant (time to drop to 1/e, where "e" is the base of Napierian logarithms, of the original value above 29° C., i.e. to drop 330° C.) was 8.4 seconds. This is a rapid cooldown for a furnace, and it includes the time lags inherent in the thermocouple measurement system. Heat up rates were checked also. To check heat up, the voltage was supplied in a rapid ramp rather than in a step function to avoid accidental burnout. The temperature step was taken from 163° C. to 559° C.

Even so, during one specific heat up run, a time constant of 10.8 seconds was achieved. This is believed to be a very rapid response time even though no further data was accumulated. The foregoing suggests that the radiant furnace 10, according to the present invention, holds great promise for unsteady state work at very high temperatures. It is even possible that with vigorous tube cooling, the heat transfer to the workpiece 42 becomes all radiative, and if so, one can utilize a shuttering arrangement whereby millisecond furnace response times are possible.

Figure 7:
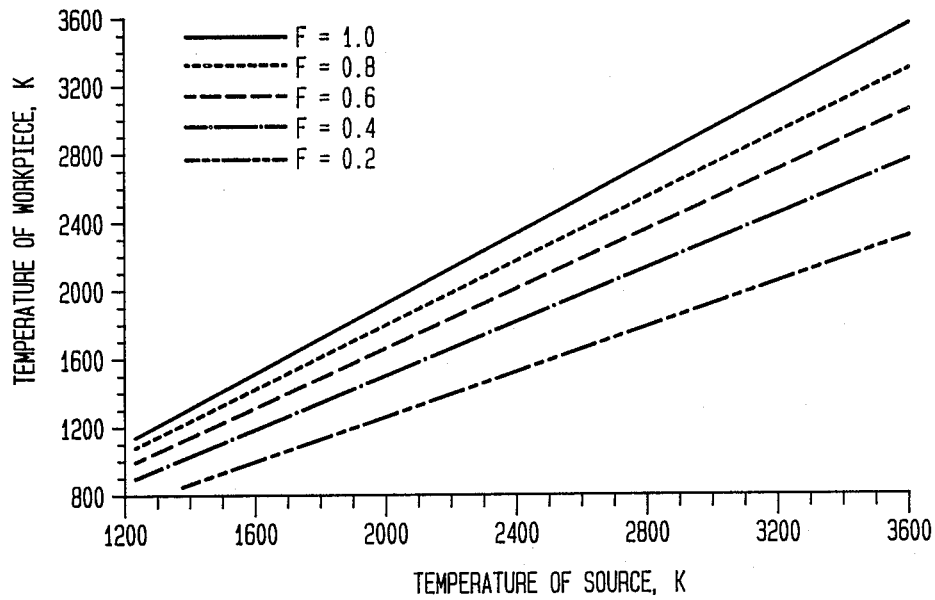
FIG. 7 is a graph of the effect of viewfactor on the workpiece temperature.

The effect of viewfactor on the temperature of a workpiece 42 is important and is illustrated in FIG. 7. The curves illustrated in FIG. 7 were generated by computer modeling of a system similar to that illustrated in FIGS. 1 and 2. It is clear that as viewfactor (F) increases towards unity, the temperature of the workpiece 42 greatly increases also. Since the radiant furnace 10 according to the present invention has a nearly 100% (i.e. F=approximately 1.0) viewfactor, it is clear that the invention is capable of achieving workpiece 42 temperatures very close to the maximum temperatures attainable with refractory metal, graphite, electric arc, or other electrical resistance heating elements; a feature not believed to be possible in other prior art furnaces.

Figure 8A:
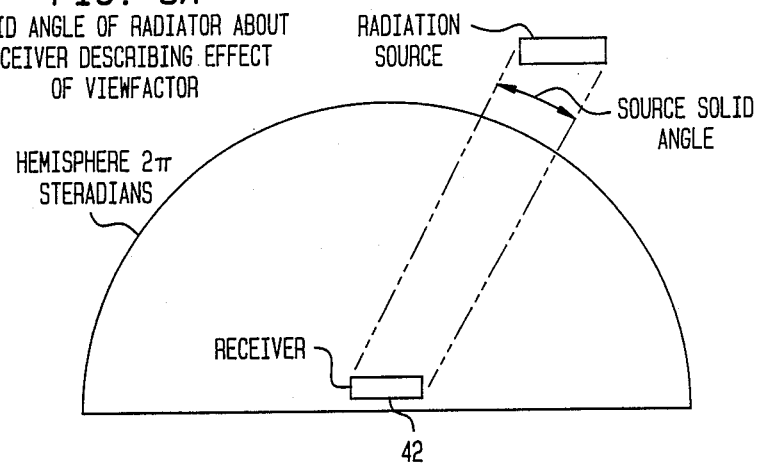
FIG. 8A illustrates the manner in which viewfactor is calculated.

The concept of viewfactor (F) is illustrated in FIGS. 8A-8D. Viewfactor, as clearly described in FIG. 8A, refers to the fraction of the solid angle about the solid surface of the workpiece 42 that is occupied by the radiant source. It is most readily explained by referring to a differential area on the workpiece 42 rather than to the entire area. The viewfactor of the entire workpiece area is obtained by integrating the expression for the viewfactor for a differential area over the entire surface of the workpiece 42. As shown in FIG. 8A, the receiver 42 "sees" the entire hemisphere above it—a solid angle of two pie ($2\pi$) steradians. The radiant energy source is also assumed to occupy part of the space above the surface and it subtends a solid angle of omega (O) steradians as seen from receiver 42 surface. The viewfactor of the radiant source as seen from the receiver surface is defined by $O/2\pi$.

Figure 8B:
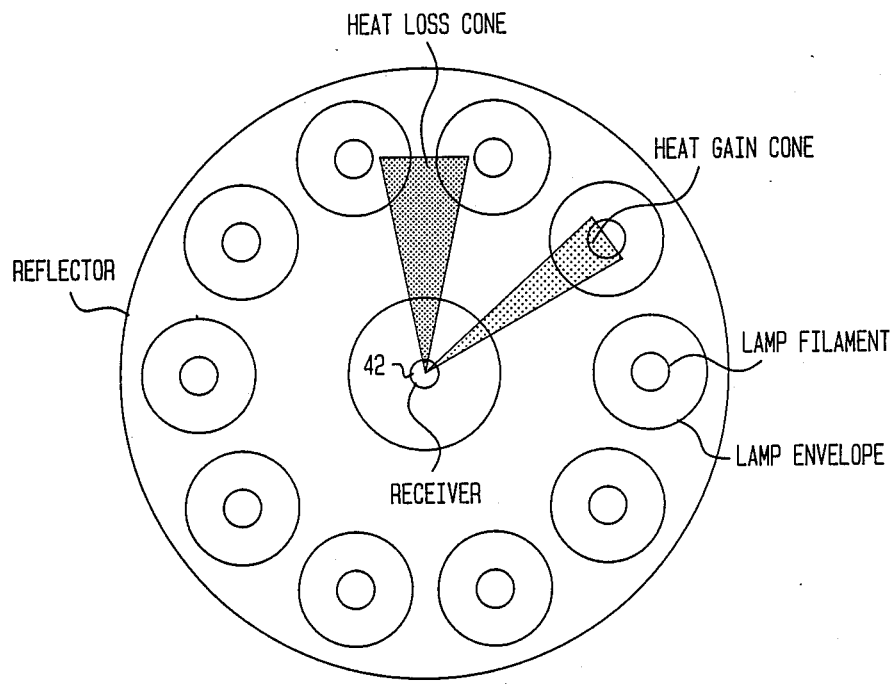
FIG. 8B illustrates the reduced viewfactor typically associated with prior art furnaces using lamp heaters.

FIG. 8B illustrates a typical layout of a prior art device. The working chamber is surrounded by a bank of quartz halogen lamps that serve as radiant heat sources. The lamps typically include tungsten filaments contained in quartz envelopes. The projected areas toward the workpiece 42 form a heat gain cone which is small relative to the total projected heat loss cone (i.e. the projected area from the workpiece 42 towards the outer envelope). Thus, as seen from the workpiece 42, the viewfactor of a single lamp is relatively small. However, there must be sufficient separation between lamps and between the filament and the lamp quartz envelope to allow for adequate cooling of the quartz envelopes which are designed to operate in the range 500°-600° C. Thus, the viewfactor of the bank of lamps as seen from the workpiece 42 is quite small. The workpiece 42 gains heat only from the portion of the hemisphere above it that is subtended by radiant sources (the lamp filaments), yet by virtue of its own temperature, and consequent thermal radiation, it loses heat to the entire hemisphere above it. Thus, for a given radiant source temperature, a small viewfactor means that the workpiece 42 reaches a low equilibrium temperature relative to the temperature of the radiant source.

The efficiency of prior art devices, such as illustrated in FIG. 8B, can be improved somewhat by placing reflectors behind the lamps. This helps, but not very much. The reflectors are not perfect, and their multiple reflections cause large radiant losses. To protect their surfaces, they must be cooled, and thus they cannot become effective radiators. As a result, prior art systems are very lossy. Also, the maximum attainable temperatures are strongly limited, energy efficiency is low, and the uniformity of the radiant field is poor.

Figure 8C:
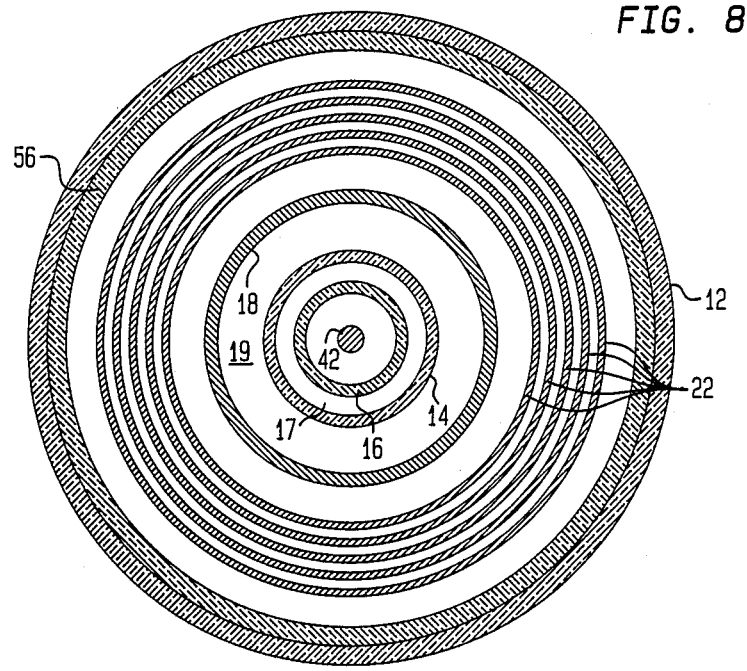
FIG. 8C is an end cross-sectional view of the present invention illustrating the improved viewfactor achievable therewith.
Figure 8D:
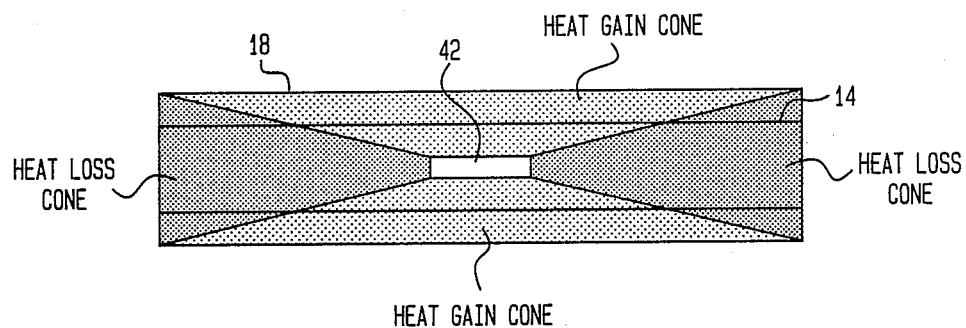
FIG. 8D illustrates the improved longitudinal or axial viewfactor effect achievable with the present invention.

The improved viewfactor achievable with the present invention is illustrated in FIGS. 2, 8C and 8D. FIG. 8C, a cross-sectional view, shows that the workpiece 42 is substantially totally surrounded by electrical heater 18. Here the workpiece 42 receives radiation from substantially the entire hemisphere above it and its heat losses to that hemisphere are very small. If it were not for the transmission losses to the tube walls, the equilibrium workpiece 42 temperature would be equal to the temperature of the radiant source 18. Radiation shielding is employed behind the heater 18 to reduce outwardly directed radiant heat losses. It achieves this effect not primarily by reflection, but rather by bringing the innermost shield to near the temperature of the heater 18, thus reducing the driving potential for outwardly directed heat transfer to near zero. FIG. 8D shows an axial section of the furnace 10 and illustrates the effect of end losses upon viewfactor. In furnace 10, the workpiece 42 is almost completely surrounded by heater 18 and shields 22, 24 and 26. The only losses are end losses within the cone bounded by the inside diameter of the heater 18 or end shields 24 and 26, whichever is smaller. If the workpiece 42 is located near the center of the heater 18, the "longitudinal" viewfactor can approach 100 percent.

The effective viewfactor of the preferred embodiment of the invention 10 is at least 80%, but can be significantly higher. By eliminating glass or quartz lamps, and thereby their envelopes, it is possible to pack heater elements very close together near the workpiece. The resulting large viewfactor permits the energy from the coils 18 to be transmitted directly to the workpiece 42 with very little radiation loss while vigorous cooling of the annulus 17 between outer tube 14 and inner tube 16 limits the tube temperatures to low values. The inner tube 16 and outer tube 14 are preferably highly transmissive to radiant energy between the infrared and ultraviolet regions. The use of multiple shields 22, 24 and 26 backed up by insulation 56 further serves to contain the heat in the interior cavity. When working properly, the temperature of the innermost shields 22, 24 and 26 approaches that of the heater elements 18 and the workpiece 42. Therefore, one has created, in effect, an extremely hot cavity in which the temperature of the workpiece 2 and the innermost shields 22, 24 and 26 is almost that of the coil 18. Therefore, the potential upper limit of the furnace is controlled substantially only by the ability of the heat source 18 to attain a high temperature. In theory, the temperature of the workpiece 42 can be brought up to temperatures substantially higher and more uniform than those believed to be presently attainable in a clean atmosphere. By vigorously cooling outer tube 14 and inner tube 16, it is possible to keep their temperatures sufficiently low so that they do not melt in the otherwise extremely hot environment, nor do they contaminate the workspace by virtue of the vapor pressure of inner tube 16 which, being cool, has a very low vapor pressure.

The preferred embodiment 10 described above employing a single helically wound coil 18 works fairly well for relatively small embodiments. However, for moderately large workpieces 42, it may have some drawbacks. In particular, if the helical coil 18 is made sufficiently large, it may be found to sag under its own weight. The sagging can bring it into contact with other components of the furnace causing shorting and/or burnout of some components. Moreover, the larger the diameter of coil 18, the larger must be the diameter of the wire from which it is wound to avoid sagging. For larger coil 18 diameters, this leads to an undesirable, very low voltage, very high current characteristic. To avoid this problem, an alternative embodiment 70 of the present invention was made and is illustrated in FIGS. 9A and 9B. Alternative embodiment 70 is especially suited for workpieces 42 larger than those described with reference to embodiment 10. The major difference between embodiment 70 and embodiment 10, is that the helical coil 18 has been replaced by a series of longitudinally oriented, coil spring-like heating elements 72. These elements 72, which resemble in shape the elements found in a common toaster, can be packed very close together as is evident in particular from FIG. 9A. With proper shielding the temperature of the innermost shields approaches that of the heating elements, as in the case of previous embodiment 10. Under such circumstances the viewfactor as seen from the workpiece 42 again exceeds at least 80 percent. Since individual coils 72 are relatively small in diameter, sag is not as much of a problem for a given wire diameter as it was with the elements 18 of embodiment 10, thus improving the voltage current characteristic for larger furnaces. Also, the individual coils can be connected in series to further improve the voltage-current characteristic.

Further testing revealed a relationship between the nitrogen coolant and the temperature of the workpiece 42 versus input power. The temperature of the workpiece 42 was determined to be relatively independent of the tube wall temperature, which can be reduced with more vigorous cooling. As previously described, the furnace 10 had a thermal time constant of approximately 8 seconds. This was achieved without any explicit attempt to provide faster response time, and it could have been lowered further if desired. This is an especially attractive feature for work that requires transient heating or cooling or for short term heating work where the long (hours to days) warm up times of conventional furnaces are inconvenient and energy inefficient.

In summary, the present invention because of its unique structure which includes multiple radiation shields surrounding electrical resistance heaters to form a near blackbody high temperature cavity to irradiate cooled semi-transparent working chamber walls, a virtually 100% viewfactor, rapid thermal response, and other parameters is able to efficiently achieve higher and more uniform temperatures in a cleaner environment than are believed to be possible through other prior art devices. In particular, the cooled chamber walls, because of their low temperature, have extremely low vapor pressures. Thus, their vapors do not contaminate the atmosphere of the working chamber, and extremely clean working environments can be achieved even when working at exceptionally high temperatures. This combination of very high uniform temperatures in a cold walled, and thus extremely clean, working environment cannot be achieved with prior art devices.

While the invention has been described with reference to its preferred embodiments, it will be appreciated by those of ordinary skill in the art that modifications can be made to the structure and materials that comprise the invention without departing from the spirit and scope of the invention as a whole.

I claim:

1. A radiant furnace apparatus comprising:
   an inner tube which is substantially highly transmissive to radiant energy in the range from infrared to ultraviolet and which defines a working chamber for containing a workpiece;
   an outer tube which is also substantially highly transmissive to radiant energy in the range from infrared to ultraviolet and which surrounds said inner tube and which forms an annulus therebetween for receiving a cooling fluid;
   a source of said cooling fluid for supplying said annulus between said inner and outer tubes and for providing a flow of cooling fluid along the length of said inner and outer tubes;
   an electrical resistance heating means connectable to a power supply and surrounding a spaced apart from said outer tube for providing radiant energy to said workpiece through said cooled inner and outer tubes;
   radiation shielding means surrounding said heating means for reducing radiant loss and non-uniformity and for forming a uniform high temperature near blackbody radiant cavity about said heating means and said outer tube; and,
   an outer shell surrounding said inner tube, said outer tube, said heating means and said shielding means for providing for maintenance of a controlled atmosphere about said heating means and said shielding means,
   wherein the radiant energy produced by said electrical resistance heating means is transmitted to said workpiece through said substantially highly transmissive inner and outer tubes cooled by said cooling fluid so that the temperature of said workpiece approaches that of said electrical resistance heater means during operation.

2. The apparatus of claim 1 wherein said radiation shielding means comprises:
   at least three layers of concentric cylindrical shielding formed from a single sheet of radiation shielding rolled into three layers.

3. The apparatus of claim 1 wherein said radiation shielding means comprises:
   at least three concentric cylindrical shields.

4. The apparatus of claim 3 wherein the heating means as seen from said workpiece has a viewfactor that exceeds 80%,
   wherein said viewfactor comprises that fraction of a solid angle about said workpiece that is occupied by said heating means.

5. The apparatus of claim 4 further comprising:
   a first and second end radiation shield located at opposite ends of said radiation shielding means.

6. The apparatus of claim 5 wherein said radiation shielding means comprises sheets of tantalum having a thickness in the range of 0.0005 to 0.05 inches.

7. The apparatus of claim 6 wherein the thickness of said tantalum sheets is in the neighborhood of 0.001 inch.

8. The apparatus of claim 7 wherein said radiation shielding means comprises five tantalum sheets.

9. The apparatus of claim 8 wherein said cooling fluid comprises nitrogen.

10. The apparatus of claim 9 wherein said inner and outer tubes are made of quartz.

11. The apparatus of claim 10 wherein argon gas is employed to protect the heating means and the radiation shielding means.

12. The apparatus of claim 11 wherein said heating means comprises a coil formed from tungsten.

13. The apparatus of claim 1 wherein said inner and outer tubes have a radiant loss of approximately 5%.

14. The apparatus of claim 1 wherein said electrical resistance heating means comprises a single resistance heater wrapped in a helical fashion around said outer tube, between said outer tube and said radiation shielding means.

15. The apparatus of claim 1 said electrical resistance heating means comprises a plurality of helically wound elements, each having a single long axis and the inner and outer tubes each have a long axis which runs substantially parallel to the long axis of each of the heating elements.

16. A radiant furnace apparatus comprising:
 an inner tube which is substantially highly transmissive to radiant energy in the range from infrared to ultraviolet and which defines a working chamber for containing a workpiece;
 an outer tube which is also substantially highly transmissive to radiant energy in the range from infrared to ultraviolet and which surrounds said inner tube and forms an annulus therebetween for receiving a cooling fluid;
 a source of said cooling fluid for supplying said annulus between said inner and outer tubes and for providing a flow of cooling fluid along the length of said inner and outer tubes heating means by a gap;
 an electrical resistance heating means connectable to a power supply and surrounding said outer tube for providing radiant energy to said workpiece through said cooled inner and outer tubes;
 shielding means surrounding said heating means for reducing radiant loss and non-uniformity and for forming a uniform high temperature near blackbody radiant cavity about said heating means and said outer tube, said radiation shielding means comprising at least three concentric cylindrical shields;
 a first and a second end radiation shielding means; and,
 an outer shell surrounding said inner tube, said outer tube, said heating means, said radiation shielding means and said first and second end radiation shields, for providing maintenance of a controlled atmosphere about said heating means, said shielding means and said first and second end radiation shields,
 wherein the radiant energy from said heating means passes through said substantially highly transmissive inner and outer tubes cooled by said cooling fluid and onto said workpiece so that the temperature of said workpiece approaches that of said heating means during operation.

17. The apparatus of claim 16 wherein said gap is approximately 2 mm.

* * * * *

UNITED STATES PATENT AND TRADEMARK OFFICE
CERTIFICATE OF CORRECTION

PATENT NO. : 4,914,276
DATED : April 3, 1990
INVENTOR(S) : David W. Blair

It is certified that error appears in the above-identified patent and that said Letters Patent is hereby corrected as shown below:

IN THE CLAIMS:

Claim 1, column 12, line 21, delete "a" (second instance), and before the word "spaced", insert the word --and--.

Claim 4, column 12, line 50, delete "3" and insert instead --2--.

Claim 15, column 13, line 15, after "claim 1" insert --wherein--.

Claim 16, column 14, line 2-3, delete "heating means by a gap".

Claim 16, column 14, line 7, after the word "tubes", insert --said outer tube being separated from said heating means by a gap--.

Claim 16, column 14, line 14, after the word "radiation", insert --shield located at opposite ends of said radiation--.

Signed and Sealed this

Twenty-second Day of October, 1991

*Attest:*

HARRY F. MANBECK, JR.

*Attesting Officer*     *Commissioner of Patents and Trademarks*